(12) United States Patent
Lee et al.

(10) Patent No.: US 11,183,628 B2
(45) Date of Patent: Nov. 23, 2021

(54) MAGNETIC MEMORY DEVICE

(71) Applicant: SAMSUNG ELECTRONICS CO., LTD., Suwon-si (KR)

(72) Inventors: Seowon Lee, Gwangmyeong-si (KR); Junghwan Moon, Seoul (KR); Junghoon Bak, Suwon-si (KR); Woojin Kim, Hwaseong-si (KR); Hyeongsun Hong, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/829,216

(22) Filed: Mar. 25, 2020

(65) Prior Publication Data
US 2021/0050508 A1 Feb. 18, 2021

(30) Foreign Application Priority Data

Aug. 14, 2019 (KR) .................. 10-2019-0099871

(51) Int. Cl.
*G11C 11/00* (2006.01)
*H01L 43/02* (2006.01)
*G11C 11/16* (2006.01)
*H01F 10/32* (2006.01)
(Continued)

(52) U.S. Cl.
CPC ............ *H01L 43/02* (2013.01); *G11C 11/161* (2013.01); *G11C 11/1659* (2013.01); *G11C 11/1673* (2013.01); *G11C 11/1675* (2013.01); *H01F 10/329* (2013.01); *H01F 10/3254* (2013.01); *H01F 10/3286* (2013.01); *H01L 27/228* (2013.01); *H01L 43/10* (2013.01)

(58) Field of Classification Search
CPC .............. G11C 11/161; G11C 11/1659; G11C 11/1673; G11C 11/1675; H01L 43/02; H01F 10/3254
USPC ........................................................ 365/158
See application file for complete search history.

(56) References Cited

U.S. PATENT DOCUMENTS 6,795,336 B2 9/2004 Kim et al.
7,307,299 B2 12/2007 Koo et al.
8,299,507 B2 10/2012 Shimizu et al.
(Continued)

FOREIGN PATENT DOCUMENTS

JP 4599285 B2 10/2010
KR 10-2019-0030795 A 3/2019

OTHER PUBLICATIONS

Observation of the inverse spin Hall effect in silicon / K.Ando, E.Saitoh / Nature Communications / p. 629 / Jan. 17, 2012.

*Primary Examiner* — Huan Hoang
(74) *Attorney, Agent, or Firm* — Lee IP Law, PC

(57) ABSTRACT

A magnetic memory device includes a device isolation layer on a substrate and defining an active region, a source region and a drain region apart from each other in the active region of the substrate, a channel portion in the active region of the substrate and between the source region and the drain region, a spin orbit torque (SOT)-inducing layer on the channel portion of the substrate, a magnetic tunnel junction (MTJ) structure on the SOT-inducing layer, the MTJ structure including a free layer on the SOT-inducing layer, a tunnel barrier layer on the free layer, and a pinned layer on the tunnel barrier, a word line on the MTJ structure, a source line electrically connected to the source region, and a bit line electrically connected to the drain region.

19 Claims, 16 Drawing Sheets

(51) Int. Cl.
*H01L 43/10* (2006.01)
*H01L 27/22* (2006.01)

(56) References Cited

U.S. PATENT DOCUMENTS

| | | |
|---|---|---|
| 9,076,541 B2 | 7/2015 | Ong et al. |
| 2003/0107915 A1* | 6/2003 | Kim .................... G11C 11/1673 365/158 |
| 2010/0080036 A1* | 4/2010 | Liu ........................ G11C 11/16 365/145 |
| 2013/0240964 A1 | 9/2013 | Ozeki et al. |
| 2019/0074043 A1 | 3/2019 | Sasaki et al. |
| 2019/0088395 A1 | 3/2019 | Ota et al. |
| 2019/0088711 A1 | 3/2019 | Shiokawa et al. |
| 2019/0131517 A1 | 5/2019 | Shiokawa et al. |

\* cited by examiner

A-A'

A-A'

MAGNETIC MEMORY DEVICE

CROSS-REFERENCE TO RELATED APPLICATION

Korean Patent Application No. 10-2019-0099871, filed on Aug. 14, 2019, in the Korean Intellectual Property Office, and entitled: "MAGNETIC MEMORY DEVICE," is incorporated by reference herein in its entirety.

BACKGROUND

1. Field

Embodiments relate to a magnetic memory device.

2. Description of the Related Art

Research has been conducted on electronic devices using magneto-resistive characteristics of a magnetic tunnel junction (MTJ) structure.

SUMMARY

Embodiments are directed to a magnetic memory device, including a device isolation layer on a substrate and defining an active region, a source region and a drain region apart from each other in the active region of the substrate, a channel portion in the active region of the substrate and between the source region and the drain region, a spin orbit torque (SOT)-inducing layer on the channel portion of the substrate, a magnetic tunnel junction (MTJ) structure on the SOT-inducing layer, the MTJ structure including a free layer on the SOT-inducing layer, a tunnel barrier layer on the free layer, and a pinned layer on the tunnel barrier, a word line on the MTJ structure, a source line electrically connected to the source region, and a bit line electrically connected to the drain region.

Embodiments are also directed to a magnetic memory device, including a device isolation layer on a substrate and defining a plurality of active regions, a source region and a drain region apart from each other in each of the plurality of active regions, a channel portion between the source region and the drain region, a plurality of magnetic memory units respectively formed on the channel portion, and a word line on the plurality of magnetic memory units and extending in a first direction parallel to an upper surface of the substrate. Each of the plurality of magnetic memory units may include a spin orbit torque (SOT) inducing layer on the channel portion, and a magnetic tunnel junction (MTJ) structure on the SOT-inducing layer, the MTJ structure including a free layer, a tunnel barrier layer, and a pinned layer. The word line may be disposed at a level higher than that of the MTJ structure.

Embodiments are also directed to a magnetic memory device, including a channel portion on a substrate and including a compound semiconductor, a source region and a drain region on the substrate and apart from each other with the channel portion therebetween, an insulating spacer on the channel portion and including a magnetic insulator, a magnetic tunnel junction (MTJ) structure on the insulating spacer, the MTJ structure including a free layer on the insulating spacer, a tunnel barrier layer on the free layer, and a pinned layer on the tunnel barrier layer, a word line on the MTJ structure, a source line electrically connected to the source region, and a bit line electrically connected to the drain region.

BRIEF DESCRIPTION OF THE DRAWINGS

Features will become apparent to those of skill in the art by describing in detail example embodiments with reference to the attached drawings in which.

DETAILED DESCRIPTION

Reference will now be made in detail to embodiments, examples of which are illustrated in the accompanying drawings.

Figure 1:
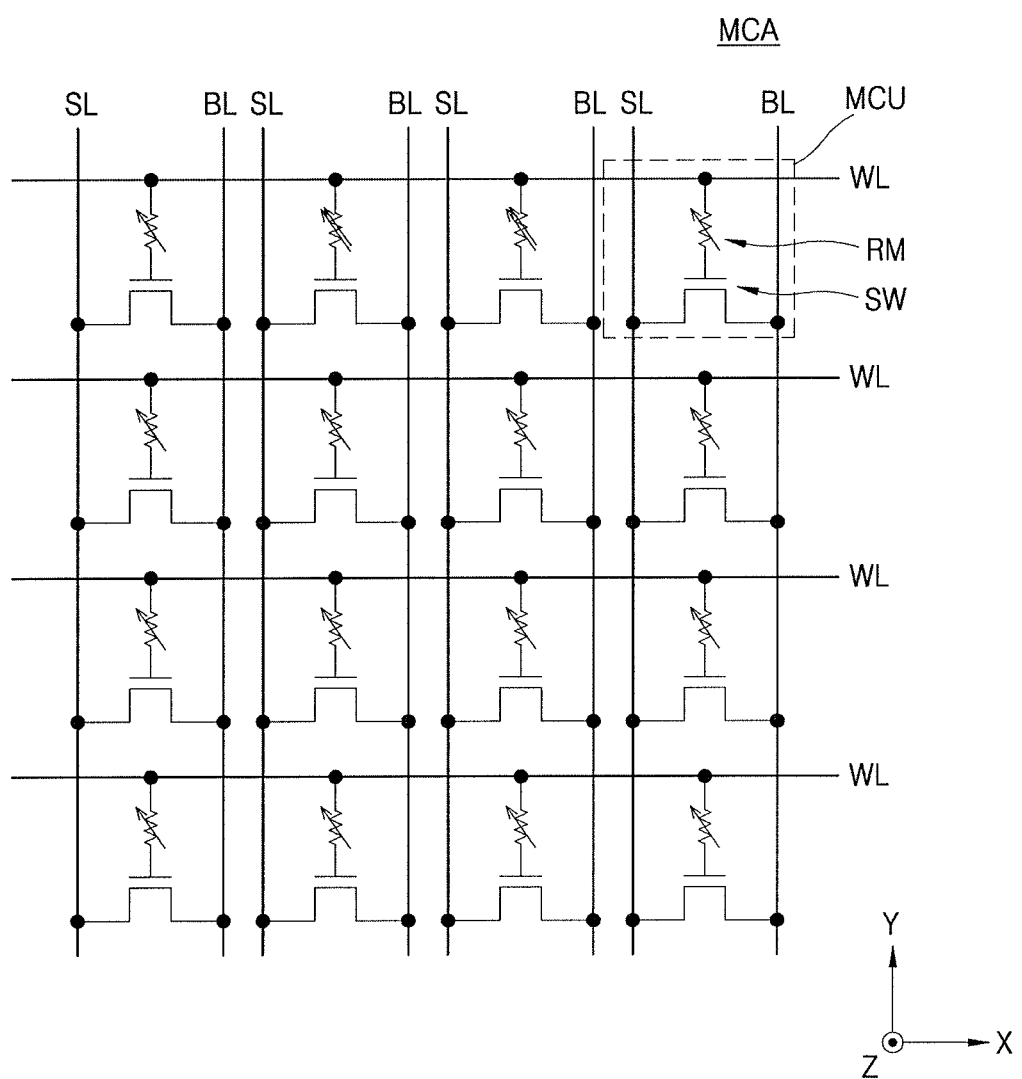
FIG. 1 illustrates a circuit diagram of a memory cell array of a magnetic memory device according to an example embodiment.

FIG. 1 is a circuit diagram of a memory cell array MCA of a magnetic memory device according to an example embodiment.

Referring to FIG. 1, the memory cell array MCA may include a memory cell unit MCU between a bit line BL and a word line WL that cross each other. The memory cell unit MCU may include a magnetic memory unit RM and a selection device SW connected to each other. The selection device SW controls the flow of charge or current to the magnetic memory unit RM, and the magnetic memory unit RM may be switched by the selection element SW. The magnetic memory unit RM may have a variable electrical resistance according to a change in a magnetization direction of a free layer 142 (see FIG. 4). For example, data may be stored in the memory cell unit MCU by using a difference in electrical resistance of the magnetic memory unit RM.

The selection device SW may include, for example, an NMOS field effect transistor or a PMOS field effect transistor. A source of the selection device SW may be connected to a source line SL extending in parallel with the bit line BL, and a drain of the selection device SW may be connected to the bit line BL. A gate of the selection device SW may be connected to the word line WL, and the magnetic memory unit RM may be between the word line WL and the gate of the selection device SW.

According to the present example embodiment, in a write operation of the memory cell unit MCU, a write voltage is applied to the word line WL, a source voltage is applied to the source line SL, and a drain voltage is applied to the bit line BL. Here, a write current may flow from the source to the drain of the selection device SW. The write current may flow in a spin orbit torque (SOT) inducing layer 130 (see FIG. 4) included in the magnetic memory unit RM, a spin current due to spin orbit interaction is generated by the write current flowing in the SOT-inducing layer 130, and a write operation may be performed as the spin current flows through a magnetic tunnel junction (MTJ) structure 140 (see FIG. 4) included in the magnetic memory unit RM.

According to the present example embodiment, in a read operation of the memory cell unit MCU, a read voltage is applied to the word line WL and a drain voltage is applied to the bit line BL. Here, a read current may flow from the word line WL to the drain of the selection device SW through the magnetic memory unit RM. Data stored in the magnetic memory unit RM may be determined according to the magnitude of a measured read current.

According to the memory cell array MCA according to an example embodiment, switching of a spin orbit interaction method is possible using one selection device SW, that is, one transistor, thereby increasing the degree of integration of the magnetic memory device. In addition, the memory cell array MCA employing the spin orbit interaction method may enable fast switching and low current operation.

Figure 2:
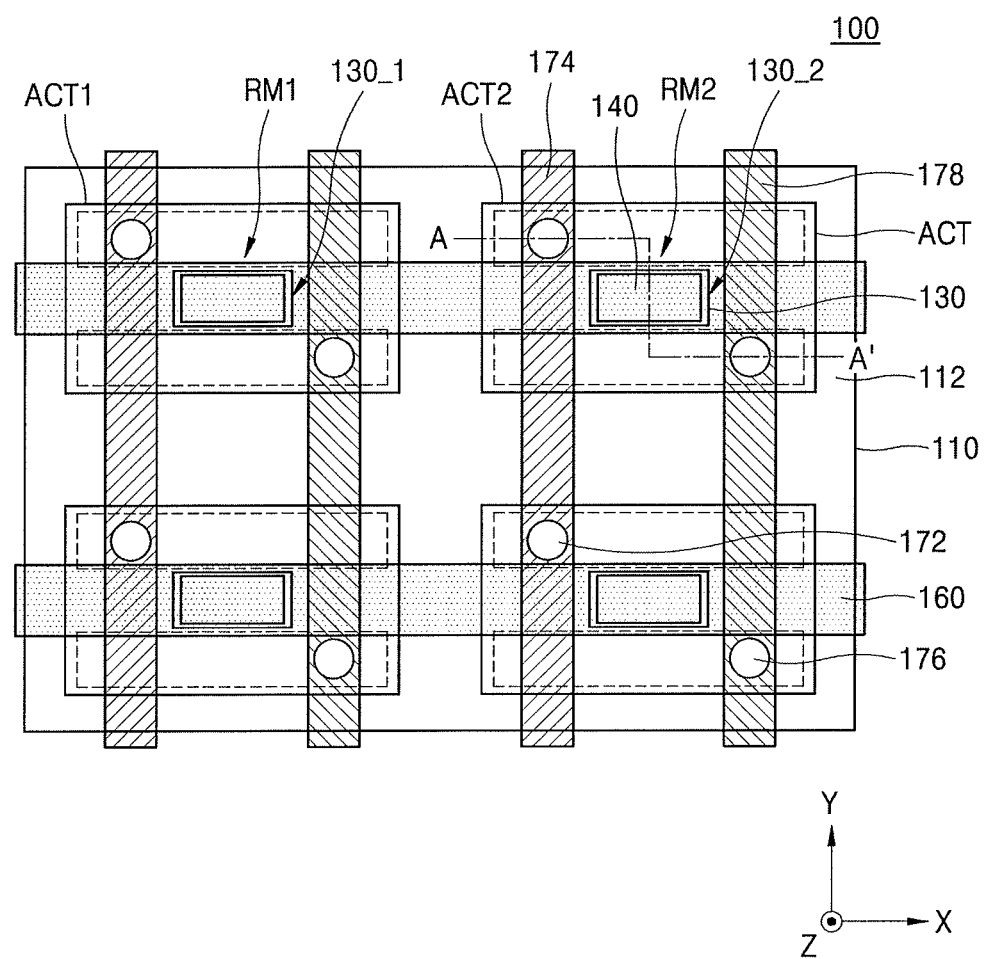
FIG. 2 illustrates a layout diagram of a magnetic memory device according to an example embodiment.
Figure 3:
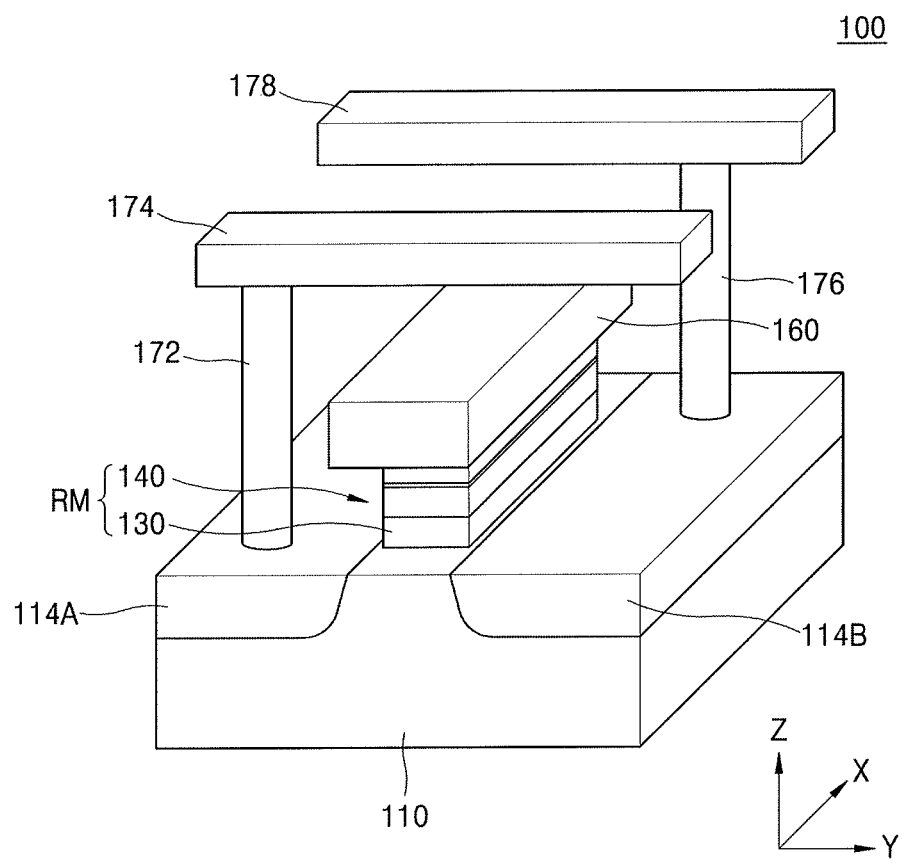
FIG. 3 illustrates a perspective view of a portion of a magnetic memory device according to an example embodiment.
Figure 4:
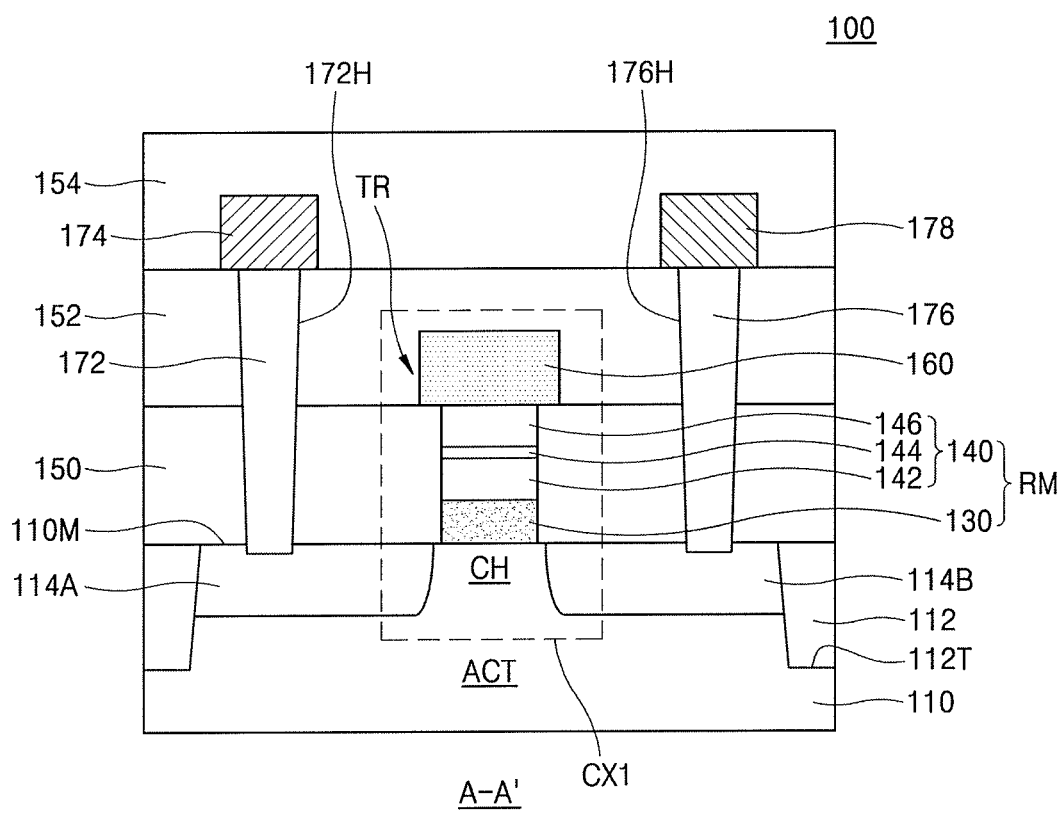
FIG. 4 illustrates a cross-sectional view taken along line A-A' of FIG. 2.
Figure 5:
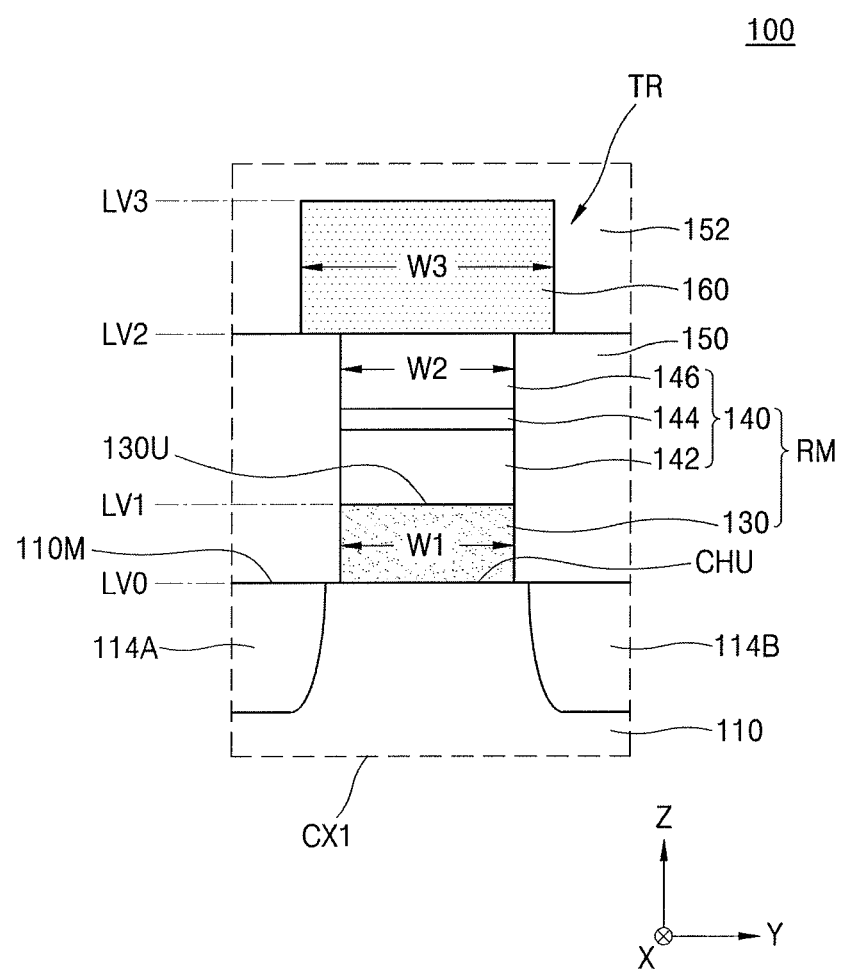
FIG. 5 illustrates an enlarged cross-sectional view of region CX1 of FIG. 4.

FIG. 2 is a layout diagram of a magnetic memory device 100 according to an example embodiment. FIG. 3 is a perspective view of a portion of the magnetic memory device 100. FIG. 4 is a cross-sectional view taken along line A-A' of FIG. 2. FIG. 5 is an enlarged cross-sectional view of region CX1 of FIG. 4.

Referring to FIGS. 2 to 5, the magnetic memory device 100 may include the magnetic memory unit RM, a word line 160, a source line 174, and a bit line 178 disposed on a substrate 110.

The word line 160 may extend in a first direction (X direction) parallel to a main surface 110M of the substrate 110 at a vertical level higher than the main surface 110M of the substrate 110. The bit line 178 may extend in a second direction (Y direction) parallel to the main surface 110M of the substrate 110 and perpendicular to the first direction (X direction) at a vertical level higher than the main surface 110M of the substrate 110. The source line 174 may extend in the second direction (Y direction) while being apart, i.e., spaced apart, from the bit line 178. The source line 174 may be disposed at the same vertical level as the bit line 178 (i.e., at the same distance from an upper surface of the substrate 110 in a vertical direction (Z direction)), for example.

In another implementation, different from what is shown in FIG. 3, the source line 174 may extend parallel to the bit line 178 in the second direction (Y direction) at a different vertical level than the bit line 178. In another implementation, different from what is shown in FIG. 3, the source line 174 may extend parallel to the word line 160 in the first direction (X direction) at a different vertical level than the bit line 178.

The substrate 110 may have the main surface 110M extending in the first direction (X direction) and the second direction (Y direction). The substrate 110 may include a semiconductor material, for example, a Group IV semiconductor, a Group III-V compound semiconductor, or a Group II-VI oxide semiconductor. For example, the substrate 110 may include the Group IV semiconductor such as silicon (Si), germanium (Ge), or Si—Ge, the Group III-V compound semiconductor such as gallium arsenide (GaAs), indium arsenide (InAs), indium phosphide (InP), or gallium nitride (GaN), or the Group II-VI oxide semiconductor such as zinc selenide (ZnSe). The substrate 110 may also be provided as a bulk wafer or an epitaxial layer. In another embodiment, the substrate 110 may include a silicon-on-insulator (SOI) substrate or a germanium-on-insulator (GeOI) substrate.

A device isolation layer 112 may be formed on the substrate 110 to define a plurality of active regions ACT. The device isolation layer 112 may fill a device isolation trench 112T formed by removing a portion of the substrate 110. As shown in FIG. 4, the device isolation layer 112 may have an upper surface disposed at the same level as the main surface 110M of the substrate 110, for example. The device isolation layer 112 may include, for example, silicon oxide, silicon oxynitride, or the like.

The plurality of active regions ACT may be arranged in the first direction (X direction) and the second direction (Y direction) in a matrix form. For example, the plurality of active regions ACT may include a first active region ACT1 and a second active region ACT2 that are sequentially disposed in the first direction (X direction). The word line 160 may extend in the first direction (X direction) so as to vertically overlap the first active region ACT1 and the second active region ACT2. The source line 174 and the bit line 178 vertically overlapping the first active region ACT1 may be apart from the source line 174 and the bit line 178 vertically overlapping the second active region ACT2. However, in other embodiments, a shared source line structure may be employed in which one source line 174 connected to both the first active region ACT1 and the second active region ACT2 sequentially arranged in the first direction (X direction), and two bit lines 178 connected to each of the first active region ACT1 and the second active region ACT2.

In the plurality of active regions ACT, a source region 114A and a drain region 114B may be apart from each other. A channel portion CH may be on the substrate 110 between the source region 114A and the drain region 114B. For example, the channel portion CH may be disposed in a portion of the plurality of active regions ACT that vertically overlaps the word line 160.

Each of a plurality of magnetic memory units RM may be disposed on the channel portion CH in each of the plurality of active regions ACT. For example, the magnetic memory unit RM may be between the word line 160 and the main surface 110M of the substrate 110, that is, between the word line 160 and the channel portion CH. The plurality of magnetic memory units RM may be arranged in the first direction (X direction) and the second direction (Y direction) in a matrix form. For example, the plurality of magnetic memory units RM may include a first magnetic memory unit RM1 and a second magnetic memory unit RM2 that are apart from each other in the first direction (X direction). The first magnetic memory unit RM1 may be on the first active region ACT1, and the second magnetic memory unit RM2 may be on the second active region ACT2.

Each of the plurality of magnetic memory units RM may include the SOT-inducing layer 130 and the MTJ structure 140. The MTJ structure 140 may include a free layer 142, a tunnel barrier layer 144, and a pinned layer 146 sequentially arranged on the SOT-inducing layer 130. The SOT-inducing layer 130 may be directly on the channel portion CH, and the MTJ structure 140 may be directly on the SOT-inducing layer 130. Therefore, an entire bottom surface of the SOT-inducing layer 130 may contact an upper surface CHU of the channel portion CH. A first insulating layer 150 may be further disposed on the substrate 110, and the first insulating layer 150 may surround a sidewall of the SOT-inducing layer 130 and a sidewall of the MTJ structure 140.

The first magnetic memory unit RM1 may be apart from the second magnetic memory unit RM2. In addition, a first SOT-inducing layer 130_1 (see FIG. 2) included in the first magnetic memory unit RM1 may be apart from a second SOT-inducing layer 130_2 (see FIG. 2) included in the second magnetic memory unit RM2. The first insulating layer 150 may surround a sidewall of the first magnetic memory unit RM1 and a sidewall of the second magnetic memory unit RM2, and a sidewall of the first SOT-inducing layer 130_1 and a sidewall of the second SOT-inducing layer 130_2 may be surrounded by the first insulating layer 150.

As shown in FIG. 2, a horizontal cross-section of the plurality of magnetic memory units RM may be rectangular, for example. In other implementations, the horizontal cross-section of the plurality of magnetic memory units RM may have various shapes such as circle, oval, triangle, square, rounded rectangle, trapezoid, polygon, and the like.

As shown in FIG. 5, a width (e.g., a first width W1 of the SOT-inducing layer 130 or a second width W2 of the MTJ structure 140) in the second direction (Y direction) of each of the plurality of magnetic memory units RM may be less than a width W3 in the second direction (Y direction) of the word line 160, for example. Unlike in FIG. 5, the width (e.g., the first width W1 of the SOT-inducing layer 130 or the second width W2 of the MTJ structure 140) in the second direction (Y direction) of each of the plurality of magnetic memory units RM may be the same as the width W3 in the second direction (Y direction) of the word line 160.

In an example embodiment, the SOT-inducing layer 130 may include a non-magnetic material with a high spin-orbit coupling characteristic and may function as a spin orbital coupling activation layer that generates spin orbital torque in an SOT-type MRAM device. In the SOT-type MRAM device, when a current flows through the SOT-inducing layer 130, the free layer 142 may be switched through a spin Hall effect, that is, through a phenomenon of spin polarization perpendicular to a current direction by interacting with the spin in a lattice of the free layer 142 in contact with the SOT-inducing layer 130.

In an example embodiment, the SOT-inducing layer 130 may include a non-magnetic metal material or a topological insulating material. For example, the SOT-inducing layer 130 may include a non-magnetic metal material of one or more of tungsten (W), platinum (Pt), tantalum (Ta), hafnium (Hf), rhenium (Re), iridium (Ir), gold (Au), silver (Ag), titanium (Ti), or copper (Cu), and/or the SOT-inducing layer 130 may include a topological insulating material of one or more of bismuth telluride ($Bi_2Te_3$), bismuth selenide ($Bi_2Se_3$), antimony telluride ($Sb_2Te_3$), molybdenum sulfide ($MoS_2$), molybdenum telluride ($MoTe_2$), tungsten sulfide ($WS_2$), or tungsten telluride ($WTe_2$). The topological insulating material may generally refer to a material having insulation properties in a bulk region thereof while portions adjacent to its surface are conductive due to particular crystallographic periodicity. For example, when the SOT-inducing layer 130 includes a topological insulating material, a portion of the SOT-inducing layer 130 adjacent to an upper surface CHU of the channel portion CH and/or a portion of the SOT-inducing layer 130 adjacent the free layer 142 may exhibit conductivity, for example.

In an example embodiment, the MTJ structure 140 may constitute a vertical type magnetic memory device 100 based on a perpendicular magnetic anisotropy (PMA) material. The pinned layer 146 has a fixed magnetization easy axis and may have a fixed magnetization direction. For example, the pinned layer 146 may have the magnetization easy axis in the third direction (Z direction), and the pinned layer 146 may include the PMA material. The free layer 142 may have a magnetization direction that is variable depending on conditions. For example, the free layer 142 may have a variable magnetization easy axis in the third direction (Z direction).

In another implementation, the pinned layer 146 may have a magnetization easy axis in the first direction (X direction) parallel to the main surface 110M of the substrate 110, and the free layer 142 may have a variable magnetization easy axis in the first direction (X direction). In this case, a horizontal type magnetic memory device may be implemented.

An electrical resistance value of the MTJ structure 140 depends on a magnetization direction of the free layer 142. When the magnetization direction of the free layer 142 and the magnetization direction of the pinned layer 146 are parallel to each other, the MTJ structure 140 has a low resistance value and may store data '0'. When the magnetization direction of the free layer 142 and the magnetization direction of the pinned layer 146 are antiparallel, the MTJ structure 140 has a high resistance value and may store data '1'. In another implementation, the MTJ structure 140 may store data '1' when having a low resistance value and may store data '0' when having a high resistance value.

The free layer 142 may include a material having a relatively low magnetic saturation (Ms), for example, one or more of MnGa, MnGe, MnAl, MnGaNi, MnGeNi, MnGaCo, MnGeCo, MnGaFe, or MnGeFe. When a current flows in an in-plane direction through the SOT-inducing layer 130, an entire bottom surface of the free layer 142 may contact an upper surface 130U of the SOT-inducing layer 130 such that a spin current generated in the SOT-inducing layer 130 is transferred to the free layer 142 by spin-orbit interaction.

The tunnel barrier layer 144 may include a non-magnetic insulator. In an example embodiment, the tunnel barrier layer 144 may include one or more of oxides of magnesium (Mg), titanium (Ti), aluminum (Al), magnesium-zinc (MgZn), or magnesium-boron (MgB), and/or nitrides of titanium (Ti) or vanadium (V). For example, the tunnel barrier layer 144 may include a magnesium oxide (MgO) film or a magnesium aluminum oxide (MgAlO) film. In another implementation, the tunnel barrier layer 144 may include a plurality of layers. For example, the tunnel barrier layer 144 may have a stacked structure of Mg/MgO, MgO/Mg, MgO/MgAlO, MgAlO/MgO, Mg/MaAlO/Mg, MgO/MgAlO/MgO, MgAlO/MgO/MaAlO, or the like. The tunnel barrier layer 144 may have a NaCl crystal structure (e.g., a face-centered cubic lattice structure). The tunnel barrier layer 144 may have a thickness of, for example, about 1 nm to about 20 nm in the third direction (Z direction) perpendicular to the upper surface of the substrate 110.

The pinned layer 146 may include at least one of a perpendicular magnetic material, a perpendicular magnetic material with an $L1_0$ structure, a CoPt alloy with a hexagonal close packed lattice structure, and a perpendicular magnetic stack. The perpendicular magnetic material may include one or more of iron (Fe), nickel (Ni), Pt, palladium (Pd), boron (B), Ta, W, Ir, or cobalt (Co), and may include, for example, one or more of CoFeB, CoFeTb, CoFeGd, or CoFeDy. For example, the perpendicular magnetic material with the $L1_0$ structure may be one or more of $Fe_{50}Pt_{50}$, $Fe_{50}Pd_{50}$, $Co_{50}Pt_{50}$, $Co_{50}Pd_{50}$, or $Fe_{50}Ni_{50}$. The perpendicular magnetic stack may include a stacked structure in which ferromagnetic layers are alternately and repeatedly arranged, or a stacked structure in which ferromagnetic layers and nonmagnetic layers are alternately and repeatedly arranged. For example, the perpendicular magnetic stack may include one or more of a (Co/Pt)n stacked structure, a (CoFe/Pt)n stacked structure, a (CoFe/Pd)n stacked structure, a (Co/Pd)n stacked structure, a (Co/Ni)n stacked structure, a (CoNi/Pt)n stacked structure, a (CoCr/Pt)n stacked structure, or a (CoCr/Pd)n stacked structure (where n is a natural number of 1 or more).

In another implementation, the pinned layer 146 may include a synthetic antiferromagnet (SAF) having a nonmagnetic layer between ferromagnetic layers. The nonmagnetic layer may include a material that enables Ruderman-Kittel-Kasuya-Yosida (RKKY) coupling between the ferromagnetic layers, for example, one or more of ruthenium (Ru), iridium (Ir), or rhodium (Rh).

The word line 160 may extend in the first direction (X direction) on the magnetic memory unit RM and the first insulating layer 150. For example, one word line 160 may be connected to the first magnetic memory unit RM1 and the second magnetic memory unit RM2 apart from each other in the first direction (X direction). The word line 160 may include conductive materials such as doped polysilicon, titanium, titanium nitride, tantalum, tantalum nitride, titanium tungsten, tungsten, aluminum, cobalt, nickel, copper, etc.

A second insulating layer 152 covering the word line 160 may be on the first insulating layer 150. The source line 174 and the bit line 178 may be on the second insulating layer 152. A source line contact 172 may be formed in a source line contact hole 172H penetrating through the first insulating layer 150 and the second insulating layer 152 to connect the source line 174 to the source region 114A. A bit line contact 176 may be formed in a bit line contact hole 176H penetrating through the first insulating layer 150 and the second insulating layer 152 to connect the bit line 178 to the drain region 114B. A third insulating layer 154 covering the source line 174 and the bit line 178 may be on the second insulating layer 152.

As shown in FIG. 5, a sidewall of the SOT-inducing layer 130 may be aligned with a sidewall of the MTJ structure 140. This structure may be obtained by a manufacturing process of sequentially forming a preliminary SOT-inducing layer, a preliminary free layer, a preliminary tunnel barrier layer, and a preliminary pinned layer on the main surface 110M of the substrate 110, and patterning these layers simultaneously or sequentially. In the patterning process, the sidewall of the SOT-inducing layer 130 and the sidewall of the MTJ structure 140 may be substantially perpendicular to the main surface 110M of the substrate 110, or the sidewall of the SOT-inducing layer 130 and the sidewall of the MTJ structure 140 may be inclined at a certain inclination angle from the main surface 110M of the substrate 110. For example, when the sidewall of the SOT-inducing layer 130 and the sidewall of the MTJ structure 140 are substantially perpendicular to the main surface 110M of the substrate 110, the SOT-inducing layer 130 may have the first width W1 in the second direction (Y direction) and the MTJ structure 140 may have the second width W2 substantially equal to the first width W1 in the second direction (Y direction).

Different from what is shown in FIG. 5, the sidewall of the SOT-inducing layer 130 and the sidewall of the MTJ structure 140 may be inclined at a certain inclination angle from the main surface 110M of the substrate 110 to be wider toward the main surface 110M of the substrate 110. In another implementation, the sidewall of the SOT-inducing layer 130 may protrude outward with respect to the sidewall of the MTJ structure 140. In these cases, the second width W2 of the MTJ structure 140 may be less than the first width W1 of the SOT-inducing layer 130. Also, different from what is shown in FIG. 5, the sidewall of the SOT-inducing layer 130 and the sidewall of the MTJ structure 140 may be inclined at a certain inclination angle from the main surface 110M of the substrate 110 to be narrower toward the main surface 110M of the substrate 110. In another implementation, the sidewall of the SOT-inducing layer 130 may be recessed inward with respect to the sidewall of the MTJ structure 140. In these cases, the second width W2 of the MTJ structure 140 may be greater than the first width W1 of the SOT-inducing layer 130.

As shown in FIG. 5, based on the main surface 110M of the substrate 110, the word line 160 may be disposed at a level higher than that of the SOT-inducing layer 130 and the MTJ structure 140. For example, the SOT-inducing layer 130, the free layer 142, the tunnel barrier layer 144, the pinned layer 146, and the word line 160 may be sequentially disposed on the upper surface CHU of the channel portion CH. Therefore, a level LV1 of the upper surface 130U of the SOT-inducing layer 130 may be higher than a level LV0 of the main surface 110M of the substrate 110, a level LV2 of an upper surface of the MTJ structure 140 may be higher than the level LV1 of the upper surface 130U of the SOT-inducing layer 130, and a level LV3 of an upper surface of the word line 160 may be higher than the level LV2 of the upper surface of the MTJ structure 140.

According to an example embodiment, the tunnel barrier layer 144 may function as a gate insulating layer of a selection transistor TR configured by the word line 160, the source region 114A, and the drain region 114B. When the selection transistor TR is turned on, a current may flow not only in the channel portion CH but also in the SOT-inducing layer 130. Thus, the SOT-inducing layer 130 may function as an auxiliary channel portion of the selection transistor TR.

In general, in a spin transfer torque (STT)-type MRAM device, a write current and a read current are passed through an MTJ structure in order to perform a write operation and a read operation, respectively. However, since a path of the write current in the write operation is the same as a path of the read current in the read operation, a read disturbance or the like may occur.

Meanwhile, in an SOT-type MRAM device using a spin orbital coupling characteristic, the path of the write current and the read current are different so that the read disturbance may be prevented, and tunneling magnetoresistance (TMR) is relatively high, which enables fast switching and low current operation. However, in a general SOT-type MRAM device, two transistors are formed to perform the write operation and the read operation. Thus, since a first transistor configured by a first word line is used for selection in the write operation and a second transistor configured by a second word line is used for selection in the read operation, an area required for one magnetic memory unit RM may be relatively large such that a degree of integration of an MRAM device may be limited.

In contrast, according to the present example embodiment, when a write voltage is applied to the word line 160, a current flows in the channel portion CH between the source region 114A and the drain region 114B, and a current may also flow in the SOT-inducing layer 130 (i.e., a portion of the SOT-inducing layer 130 corresponding to the auxiliary channel portion) in contact with the channel portion CH. Since a spin current is generated in a direction perpendicular to the upper surface 130U of the SOT-inducing layer 130 by the current flowing in the SOT-inducing layer 130, a magnetization direction of the free layer 142 may be controlled by using a current flowing in the selection transistor TR. Therefore, read and write operations may be performed with respect to one magnetic memory unit RM using one selection transistor TR. The magnetic memory device 100 may thus enable fast switching and low current operation while exhibiting an improved degree of integration.

Hereinafter, a driving method of the magnetic memory device 100 according to an example embodiment will be described with reference to FIGS. 6 to 8.

Figure 6:
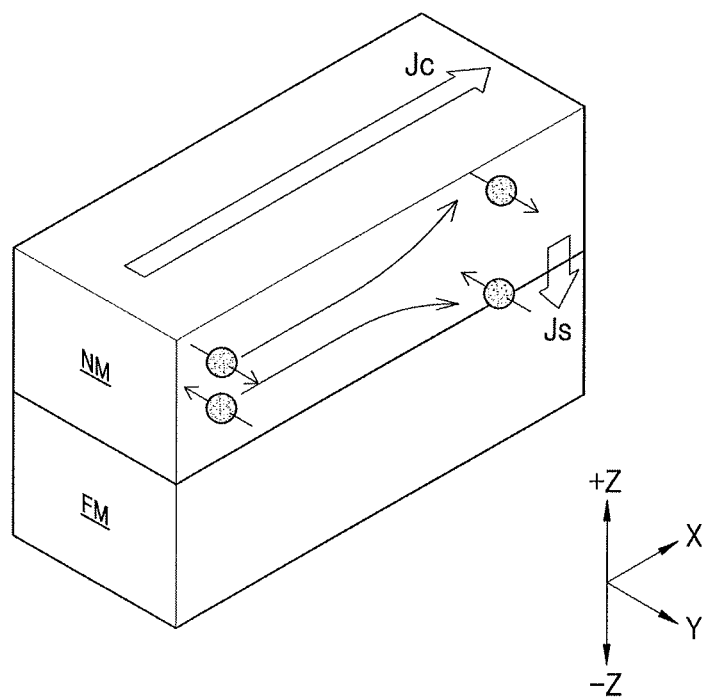
FIGS. 6 to 8 illustrate schematic views illustrating a method of driving a magnetic memory device, according to an example embodiment.

FIG. 6 schematically shows a spin current generated by a current in a junction structure of non-magnetic and magnetic materials.

Referring to FIG. 6, in a stacked structure of a non-magnetic material layer NM and a magnetic metal layer FM, a current may flow in a longitudinal direction of the non-magnetic material layer NM of the stacked structure (e.g., a longitudinal direction of the stacked structure or the X direction of FIG. 6). For example, the non-magnetic material layer NM may include a non-magnetic material having a high spin-orbit coupling characteristic, for example, a non-magnetic metal material or a topological insulator material. Here, a current due to a charge transfer may be represented by $J_C$. Due to the high spin-orbit coupling characteristic of the non-magnetic material layer NM, electrons with one spin (e.g., spin-up) may be deflected in a horizontal direction of the non-magnetic material layer NM (e.g., a vertical direction of a longitudinal direction of the stacked structure or a +Z direction of FIG. 6), and electrons with the opposite spin (e.g., spin-down) may be deflected in another direction (e.g., a −Z direction of FIG. 6). For example, when a current flows in the X direction, spin-up accumulates in the +Z direction and spin-down accumulates in the −Z direction. Adding these together, a spin current may occur in the −Z direction (or in the +Z direction). This spin current may be represented by $J_S$ in FIG. 6. That is, when a current flows in the non-magnetic material layer NM, the spin current $J_S$ may be induced in a direction perpendicular to the direction of a current $J_C$, and spin torque may be transmitted to the magnetic metal layer FM in contact with the non-magnetic material layer NM.

Figure 7:
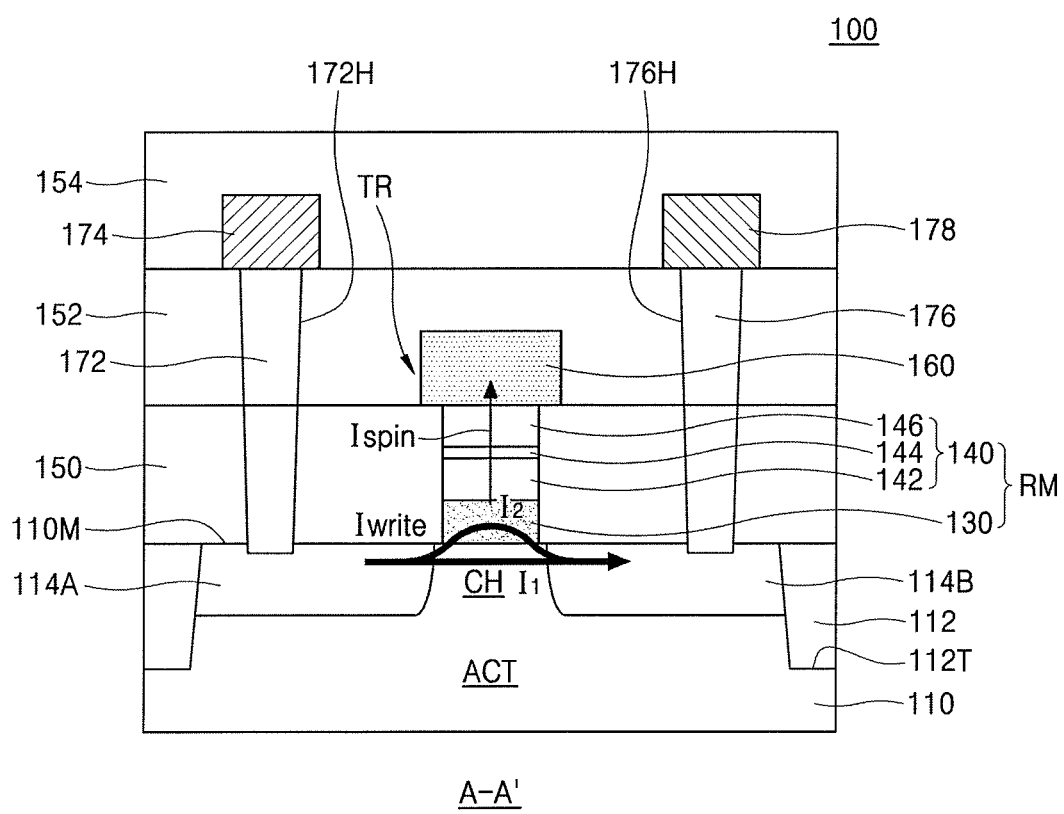
Figure 8:
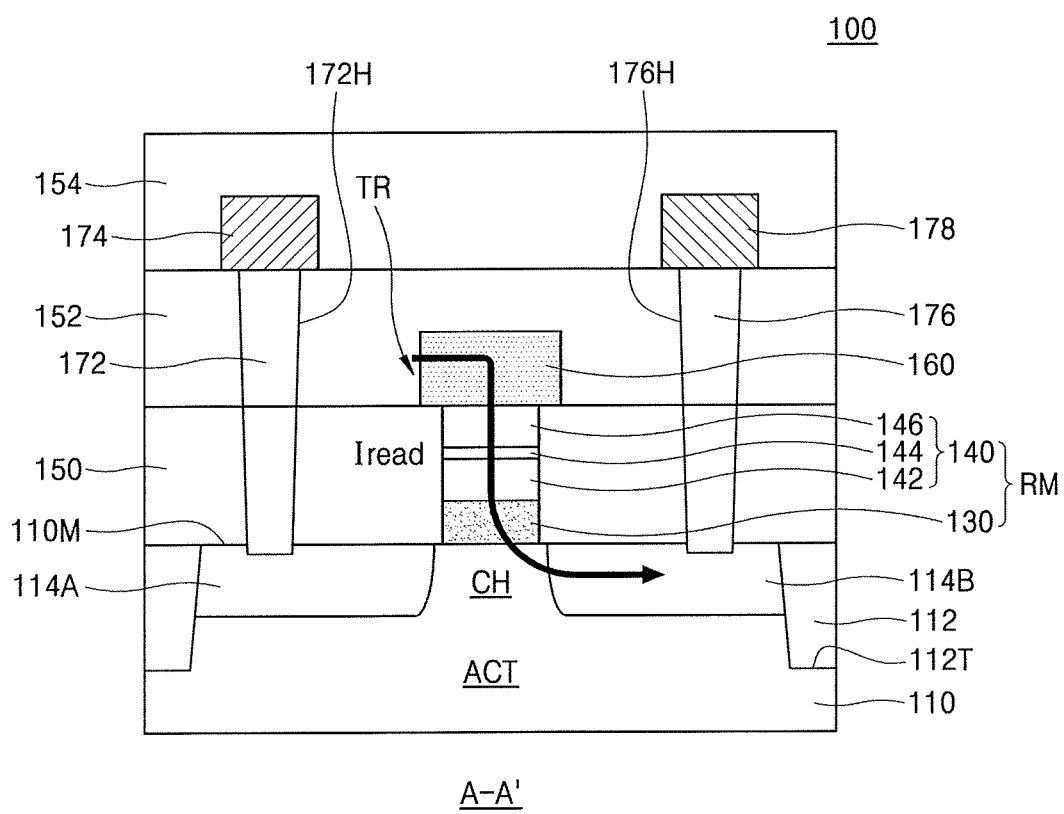

FIGS. 7 and 8 schematically show write and read operations of the magnetic memory device 100 according to an example embodiment.

Referring to FIG. 7, in a write operation of the magnetic memory device 100, the selection transistor TR may be turned on when a write voltage is applied to the word line 160, a source line voltage is applied to the source line 174, and a drain voltage is applied to the bit line 178, and a write current $I_{write}$ flows from the source region 114A to the drain region 114B via the channel portion CH. Here, the write current $I_{write}$ may flow through the SOT-inducing layer 130 contacting the channel portion CH as well as the channel portion CH. For example, FIG. 7 schematically illustrates a portion of the write current $I_{write}$ flowing through the channel portion CH as the first write current and a portion of the write current $I_{write}$ flowing through the SOT-inducing layer 130 as the second write current $I_2$. By a spin Hall effect of the SOT-inducing layer 130, for example, a spin current $I_{spin}$ may be generated in the SOT-inducing layer 130 by the second write current $I_2$ and applied to the free layer 142. The spin current $I_{spin}$ may occur in a direction perpendicular to the write current $I_{write}$ (or the second write current $I_2$). Accordingly, the magnetization direction of the free layer 142 may be changed by the spin current $I_{spin}$, and thus data may be written to the magnetic memory unit RM.

Referring to FIG. 8, when a read voltage is applied to the word line 160 and a drain voltage is applied to the bit line 178, the read current $I_{read}$ may flow through the word line 160, the MTJ structure 140, the SOT-inducing layer 130, the channel portion CH, and the drain region 114B. The value of the read current $I_{read}$ may vary depending on the resistance state of the MTJ structure 140, that is, the magnetization direction of the free layer 142 and the magnetization direction of the pinned layer 146. For example, when the magnetization direction of the free layer 142 and the magnetization direction of the pinned layer 146 are parallel to each other, the MTJ structure 140 may have a low resistance value. In contrast, when the magnetization direction of the free layer 142 and the magnetization direction of the pinned layer 146 are antiparallel to each other, the MTJ structure 140 may have a high resistance value. By comparing the measured read current $I_{read}$ with a comparison value, it is possible to detect whether the MTJ structure 140 is in a low resistance state (data 0 or 1) or a high resistance state (data 1 or 0). Accordingly, data stored in the MTJ structure 140 may be determined.

As shown in FIGS. 7 and 8, according to the magnetic memory device 100 of the present example embodiment, a write operation may be performed using the write current $I_{write}$ flowing through the selection transistor TR. Therefore, while both the read operation and the write operation are performed by the selection transistor TR of the word line 160, a current path in the read operation and a current path in the write operation may be different. Therefore, a separate transistor connected to the SOT line does not need to be formed for the write operation (e.g., it is not necessary to form a first transistor for the write operation and a second transistor for the read operation for a single magnetic memory unit), and thus the degree of integration of the magnetic memory device 100 may be improved.

Figure 9:
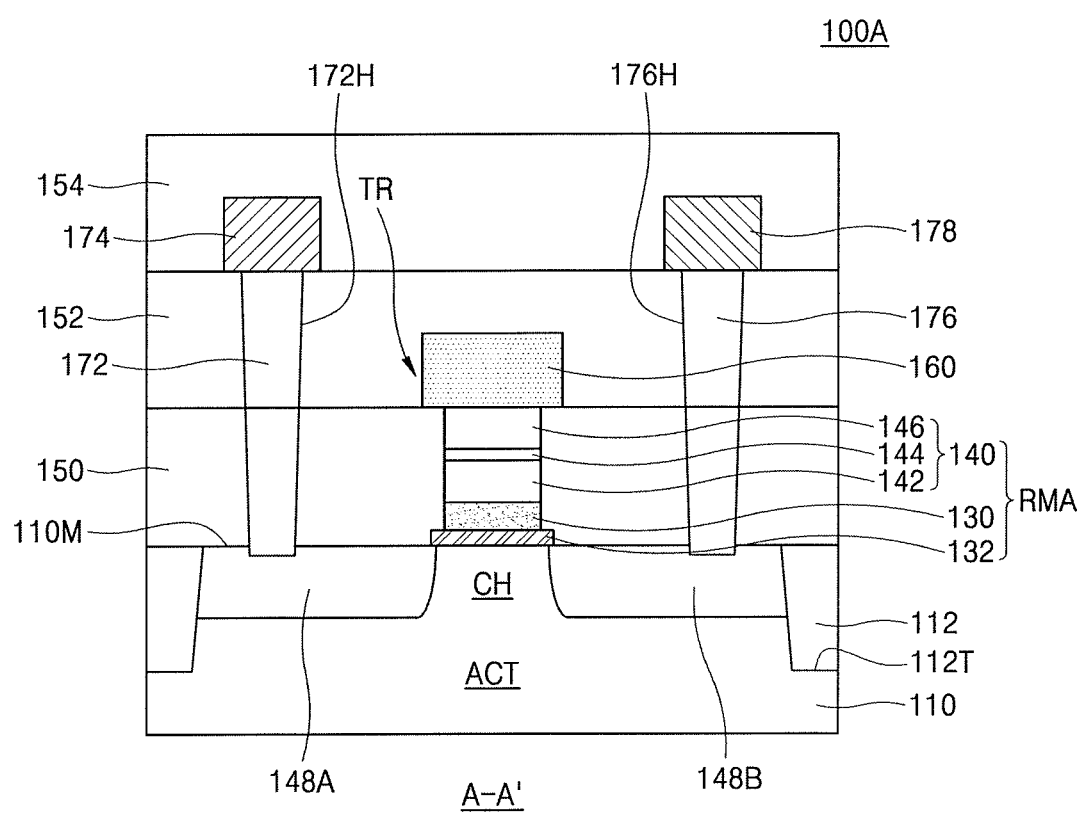
FIG. 9 illustrates a cross-sectional view of a magnetic memory device according to an example embodiment.

FIG. 9 is a cross-sectional view of a magnetic memory device 100A according to an example embodiment. FIG. 9 is a cross-sectional view taken along line A-A' of FIG. 2. In FIG. 9, the same reference numerals like in FIGS. 1 through 8 denote the same elements.

Referring to FIG. 9, a magnetic memory unit RMA may include a metal silicide layer 132, the SOT-inducing layer 130, and the MTJ structure 140. The metal silicide layer 132 may include, for example, nickel silicide, cobalt silicide, tungsten silicide, or the like, and the SOT-inducing layer 130 may include, for example, a non-magnetic metal material of one or more of W, Pt, Ta, Hf, Re, Ir, Au, Ag, Ti, or Cu.

According to the present example embodiment, the metal silicide layer 132 between the SOT-inducing layer 130 and the channel portion CH may help to reduce contact resistance between the channel portion CH including a semiconductor material and the SOT-inducing layer 130 including a metal material. Accordingly, the amount of the write current $I_{write}$ flowing through the SOT-inducing layer 130 may be increased by the metal silicide layer 132, and thus the magnetic memory device 100A may perform low power operation. In addition, since read and write operations may be performed using one selection transistor TR with respect to one magnetic memory unit RMA, the degree of integration of the magnetic memory device 100A may be improved.

Figure 10:
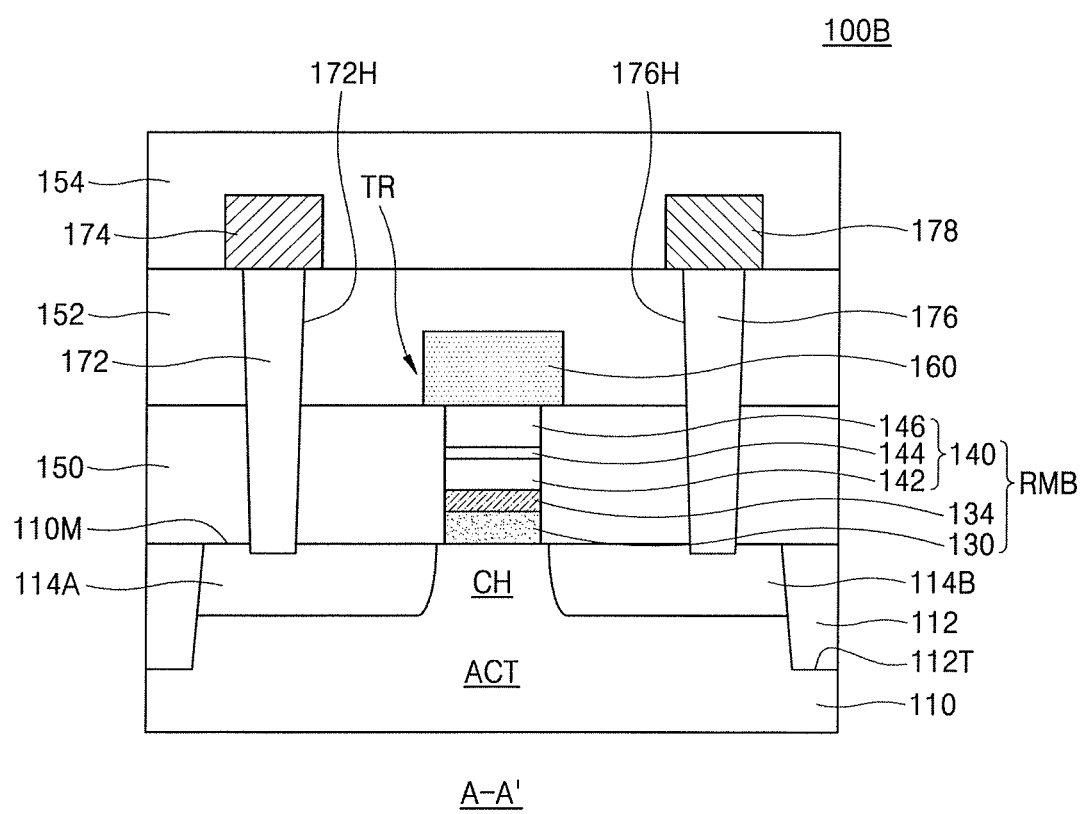
FIG. 10 illustrates a cross-sectional view of a magnetic memory device according to an example embodiment.

FIG. 10 is a cross-sectional view of a magnetic memory device 100B according to an example embodiment. FIG. 10 is a cross-sectional view taken along line A-A' of FIG. 2. In FIG. 10, the same reference numerals like in FIGS. 1 to 9 denote the same elements.

Referring to FIG. 10, a magnetic memory unit RMB according to the present example embodiment may include the SOT-inducing layer 130, an insulating spacer 134, and the MTJ structure 140.

For example, the insulating spacer 134 may include a magnetic insulator. For example, the magnetic insulator may be yttrium iron garnet (YIG, $Y_3Fe_5O_{12}$), nickel ferrite ($NiFe_2O_4$), manganese ferric oxide ($MnFe_2O_4$), nickel zinc ferrite ($Ni_{1-x}Zn_xFeO_4$), or manganese zinc ferrite ($Mn_{1-x}Zn_xFeO_4$).

According to the present example embodiment, the insulating spacer 134 is disposed between the SOT-inducing layer 130 and the free layer 142. Thus, tunneling magnetoresistance (TMR) of the magnetic memory unit RMB may be improved, and the magnetic memory device 100B may enable low power operation. In addition, since read and write operations may be performed using one selection transistor TR with respect to one magnetic memory unit RMB, the degree of integration of the magnetic memory device 100B may be improved.

Figure 11:
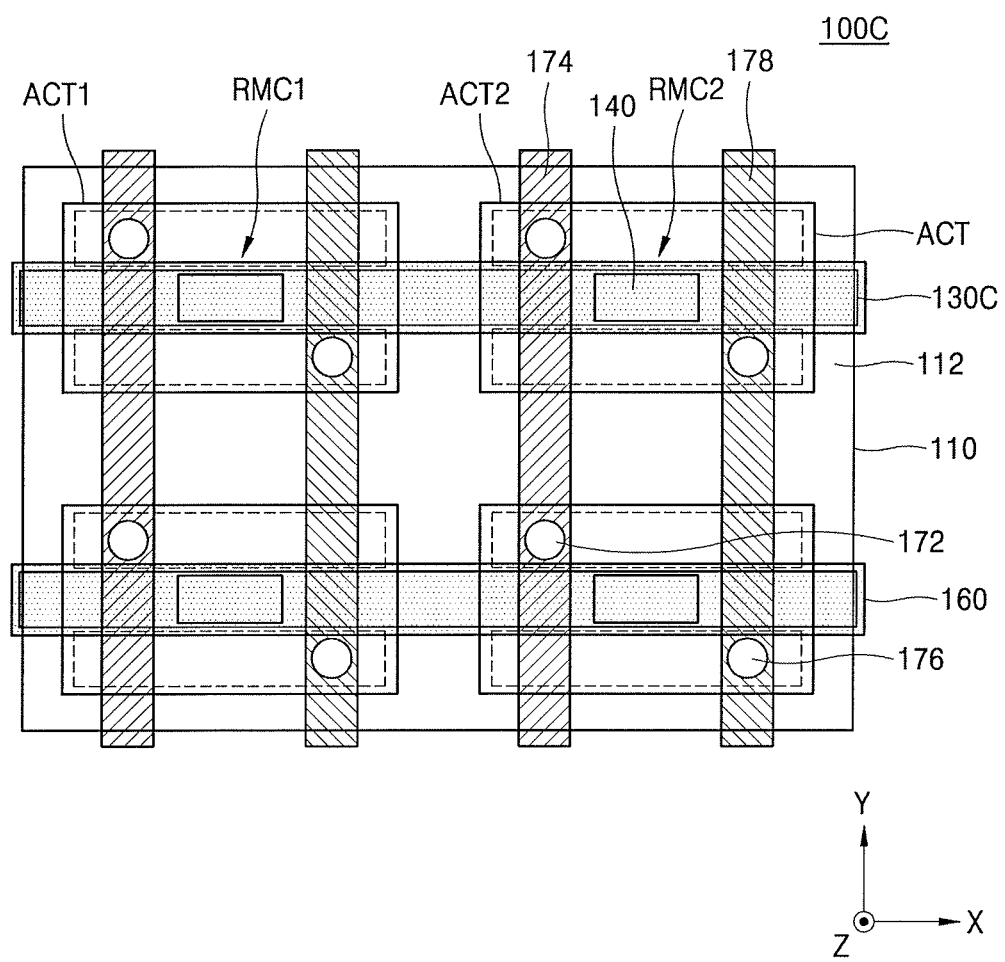
FIG. 11 illustrates a layout diagram of a magnetic memory device according to an example embodiment.
Figure 12:
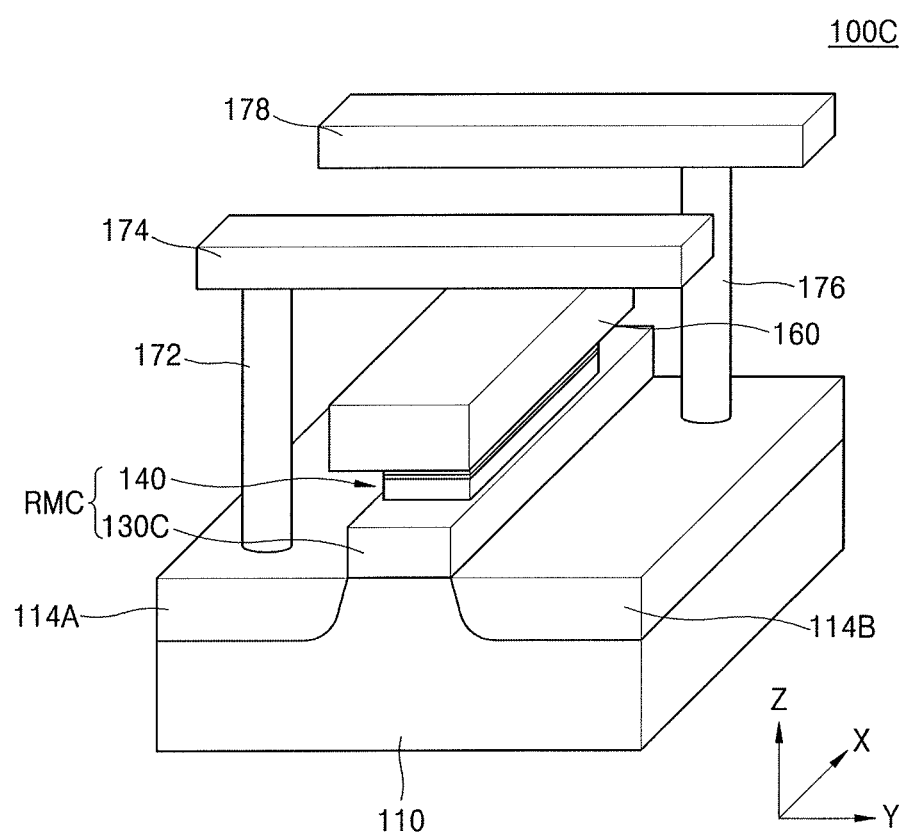
FIG. 12 illustrates a perspective view of a portion of a magnetic memory device.

FIG. 11 is a layout diagram of a magnetic memory device 100C according to an example embodiment. FIG. 12 is a perspective view of a portion of the magnetic memory device 100C.

Referring to FIGS. 11 and 12, the plurality of active regions ACT may be arranged in a matrix form in the first direction (X direction) and the second direction (Y direction). The plurality of active regions ACT may include the first active region ACT1 and the second active region ACT2 that are sequentially disposed in the first direction (X direction). The word line 160 may vertically overlap the first active region ACT1 and the second active region ACT2 and may extend in the first direction (X direction).

The plurality of magnetic memory units RMC may include a first magnetic memory unit RMC1 and a second magnetic memory unit RMC2 arranged in the first direction (X direction), and an SOT-inducing layer 130C may extend in the first direction (X direction) and may be shared by the first magnetic memory unit RMC1 and the second magnetic memory unit RMC2. That is, a portion of the SOT-inducing layer 130C included in the first magnetic memory unit RMC1 and a portion of the SOT-inducing layer 130C included in the second magnetic memory unit RMC2 may be connected to each other.

According to an example embodiment, the SOT-inducing layer 130C may contact the upper surface of the substrate 110 and an upper surface of the device isolation layer 112 and may extend in the first direction (X direction).

In another implementation, different from FIG. 12, the metal silicide layer 132 (see FIG. 9) may be further formed between the SOT-inducing layer 130C and the upper surface of the substrate 110. In addition, different FIG. 12, the insulating spacer 134 (see FIG. 10) including a magnetic insulator may be further formed between the SOT-inducing layer 130C and the MTJ structure 140. The metal silicide layer 132 and/or the insulating spacer 134 may extend in the first direction (X direction) or may be formed only at a position vertically overlapping the first magnetic memory unit RMC1 and the second magnetic memory unit RMC2.

Figure 13:
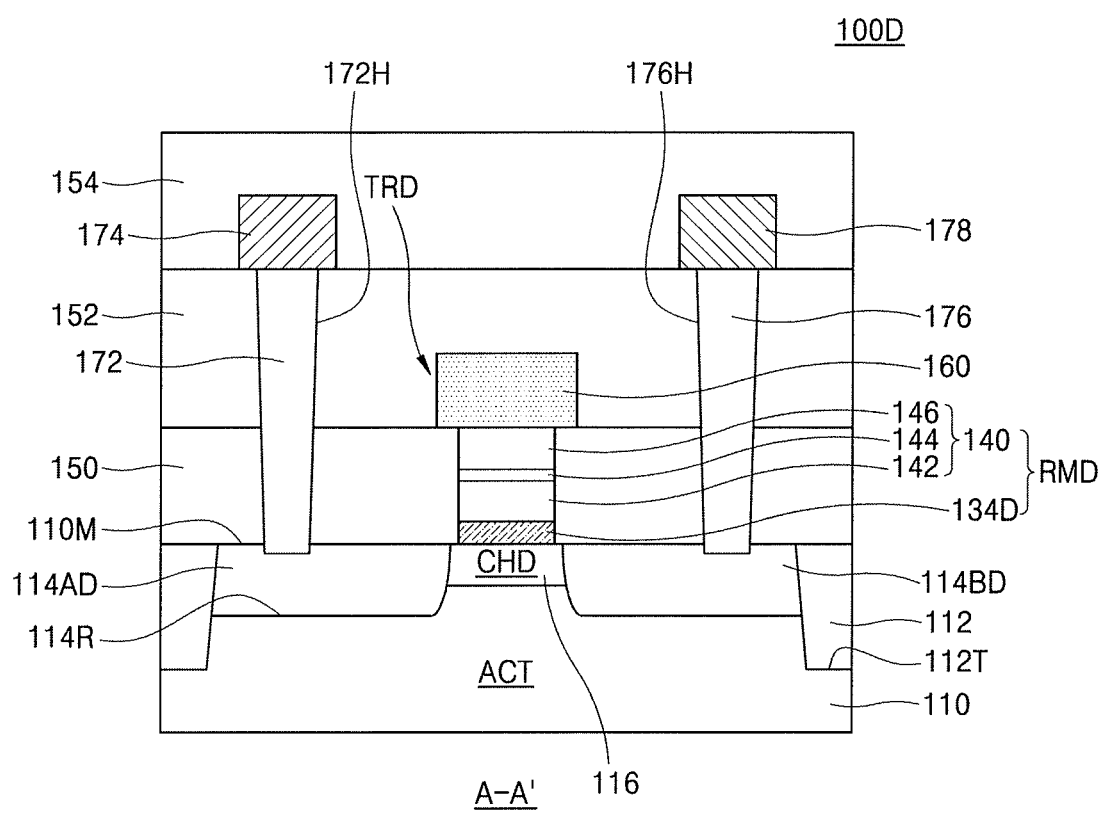
FIG. 13 illustrates a cross-sectional view of a magnetic memory device according to an example embodiment.

FIG. 13 is a cross-sectional view of a magnetic memory device 100D according to an example embodiment. FIG. 13 is a cross-sectional view taken along line A-A' of FIG. 2. In FIG. 13, the same reference numerals like in FIGS. 1 to 12 denote the same elements.

Referring to FIG. 13, the device isolation layer 112 may be formed on the substrate 110 to define the plurality of active regions ACT. In an example embodiment, the substrate 10 may include a Group IV semiconductor, a Group III-V compound semiconductor, or a Group II-VI oxide semiconductor. For example, the substrate 110 may include the Group IV semiconductor such as Si, Ge, or Si—Ge, the Group III-V compound semiconductor such as GaAs, InAs, InP, or GaN, or the Group II-VI oxide semiconductor such as ZnSe.

A pair of recess regions 114R formed by removing a portion of the substrate 110 may be formed in the active regions ACT, and a source region 114AD and a drain region 114BD filling the pair of recess regions 114R may be apart from each other. The source region 114AD and the drain region 114BD may include a semiconductor layer (not shown) formed in a pair of recess regions 114R using a selective epitaxial growth (SEG) process or the like, where the pair of recess regions 114R are formed by removing a portion of the substrate 110. The source region 114AD and the drain region 114BD may include the Group IV semiconductor, the Group III-V compound semiconductor, or the Group II-VI oxide semiconductor.

A channel portion CHD may be on the substrate 110 between the source region 114AD and the drain region 114BD. The channel portion CHD may include the same material as the substrate 110 or may include a material different from the substrate 110. For example, when the channel portion CHD includes a material different from the substrate 110, the channel portion CHD may include a semiconductor layer 116 formed by performing an epitaxial growth process on the upper surface of the substrate 110.

In an example embodiment, the channel portion CHD may include a compound semiconductor. For example, the channel portion CHD may include the Group III-V compound semiconductor such as GaAs, InAs, InP, or GaN, or the Group II-VI oxide semiconductor such as ZnSe. In some embodiments, the channel portion CHD may include a compound semiconductor in which an SOT-inducing dopant is included at a first concentration. For example, the SOT-inducing dopant may include one or more of Ga, Al, In, B, or P.

In an example, the channel portion CHD may include a ternary semiconductor compound of gallium arsenide containing aluminum, e.g., $Al_xGa_{1-x}As$ ($0.01 \le x \le 0.5$), at a first concentration as the SOT-inducing dopant. In another example, the channel portion CHD may include a ternary semiconductor compound of gallium arsenide containing indium, e.g., $In_xGa_{1-x}As$ ($0.01 \le x \le 0.5$) at a first concentration as the SOT-inducing dopant.

In another example, the channel portion CHD may be formed in a stacked structure including the semiconductor layer 116 and a capping semiconductor layer (not shown) formed on the semiconductor layer 116. The semiconductor layer 116 and the capping semiconductor layer may include one or more of GaAs, InAs, InP, GaN, or ZnSe. In addition, the semiconductor layer 116 and/or the capping semiconductor layer may include one or more of GaAs, InAs, InP, GaN, or ZnSe containing the SOT-inducing dopant at a first concentration. In some examples, the semiconductor layer 116 may include a ternary semiconductor compound of gallium arsenide containing indium, e.g., $In_xGa_{1-x}As$ ($0.01 \le x \le 0.5$), at a first concentration as the SOT-inducing dopant, and the capping semiconductor layer may include GaAs.

As shown in FIG. 13, a bottom surface of the channel portion CHD may be disposed at a higher level than the source region 114AD and the drain region 114BD. For example, the channel portion CHD may be formed by forming the semiconductor layer 116 on the substrate 110 by an epitaxial growth process, and then the pair of recess regions 114R may be formed by removing a portion of the semiconductor layer 116 and the substrate 110 together. However, different from what is shown in FIG. 13, the bottom surface of the channel portion CHD may be disposed at the same level as or lower level than that of a bottom surface of the source region 114AD and the drain region 114BD.

In another implementation, the channel portion CHD may be formed by forming the semiconductor layer 116 on the substrate 110 by an epitaxial growth process, and the source region 114AD and the drain region 114BD may be formed by implanting impurities into a portion of the substrate 110 and the semiconductor layer 116. In this case, the pair of recess regions 114R may not be formed.

A plurality of magnetic memory units RMD may be disposed on the channel portion CHD of each of the plurality of active regions ACT. Each of the plurality of magnetic memory units RMD may include an insulating spacer 134D and the MTJ structure 140. The word line 160 extending in the first direction (X direction) may be on the plurality of magnetic memory units RMD.

The insulating spacer 134D may be on the channel portion CHD. For example, the insulating spacer 134D may include a magnetic insulator. For example, the magnetic insulator may be $Y_3Fe_5O_{12}$, $NiFe_2O_4$, $MnFe_2O_4$, $Ni_{1-x}Zn_xFeO_4$, and $Mn_{1-x}Zn_xFeO_4$. The insulating spacer 134D may function as a gate insulating layer of a selection transistor TRD constituted by the word line 160, the source region 114AD, and the drain region 114BD.

The MTJ structure 140 may be on the insulating spacer 134D. Accordingly, the free layer 142, the tunnel barrier layer 144, and the pinned layer 146 may be sequentially disposed on the insulating spacer 134D.

According to an example embodiment, the channel portion CHD includes a compound semiconductor or a compound semiconductor including the SOT-inducing dopant. The channel portion CHD may not only function as a channel region of the selection transistor TRD, but may also function as a spin orbital coupling activation layer that generates spin orbital torque SOT by a spin Hall effect. Accordingly, a spin current may be generated in a direction perpendicular to an upper surface of the channel portion CHD by a current flowing in the channel portion CHD, and the spin current may flow to the free layer 142 in contact with the channel portion CHD (or connected to the channel portion CHD through the insulating spacer 134D including a magnetic insulator).

The first insulating layer 150 may surround sidewalls of a magnetic memory unit RMD. As shown in FIG. 13, a sidewall of the insulating spacer 134D and a sidewall of the MTJ structure 140 may be aligned with respect to each other. This may be a structure obtained by a manufacturing process of sequentially forming a preliminary insulating spacer layer, a preliminary free layer, a preliminary tunnel barrier layer, and a preliminary pinned layer on the channel portion CHD, the source region 114AD, the drain region 114BD, and the device isolation layer 112 and patterning the layers. In the patterning process, the sidewall of the insulating spacer 134D and the sidewall of the MTJ structure 140 may be substantially perpendicular to the main surface 110M of the substrate 110, or the sidewall of the insulating spacer 134D and the sidewall of the MTJ structure 140 may be inclined at a certain inclination angle from the main surface 110M of the substrate 110. Different from what is shown in FIG. 13, the sidewall of the insulating spacer 134D may be recessed inwardly or protrude outwardly from the sidewall of the MTJ structure 140.

Figure 14:
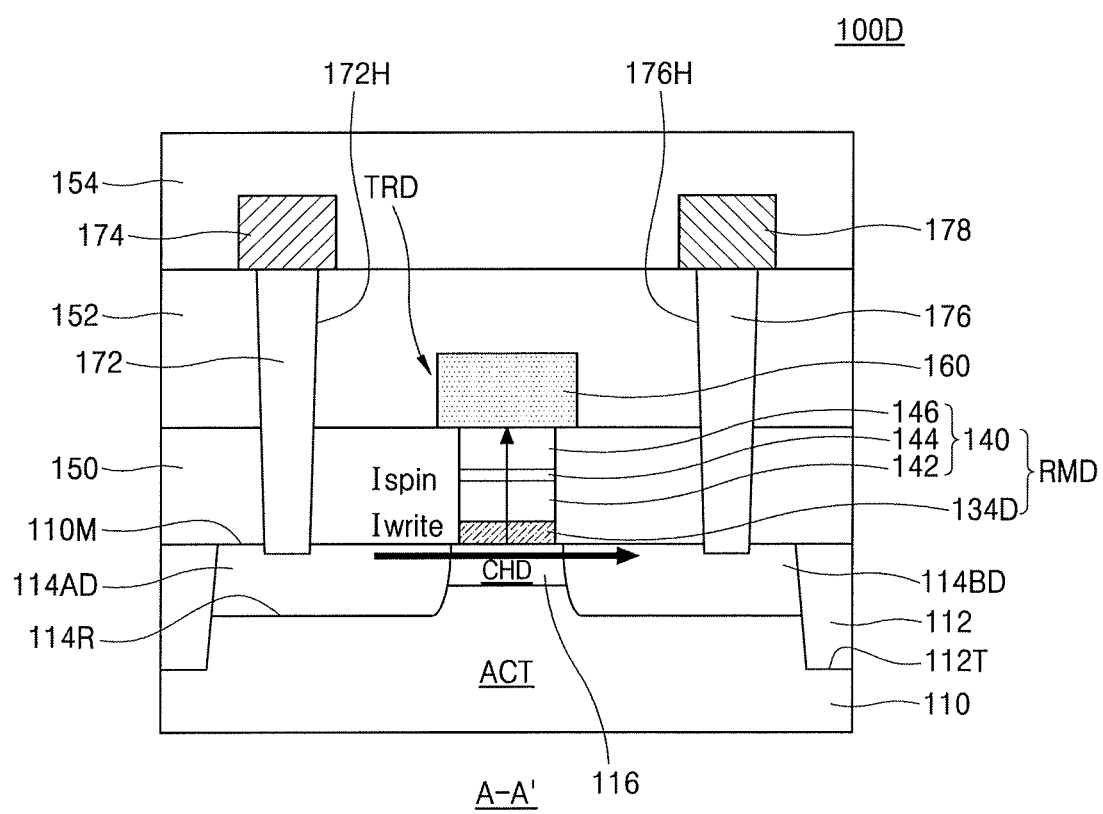
FIGS. 14 and 15 illustrate schematic views illustrating a method of driving a magnetic memory device, according to an example embodiment.
Figure 15:
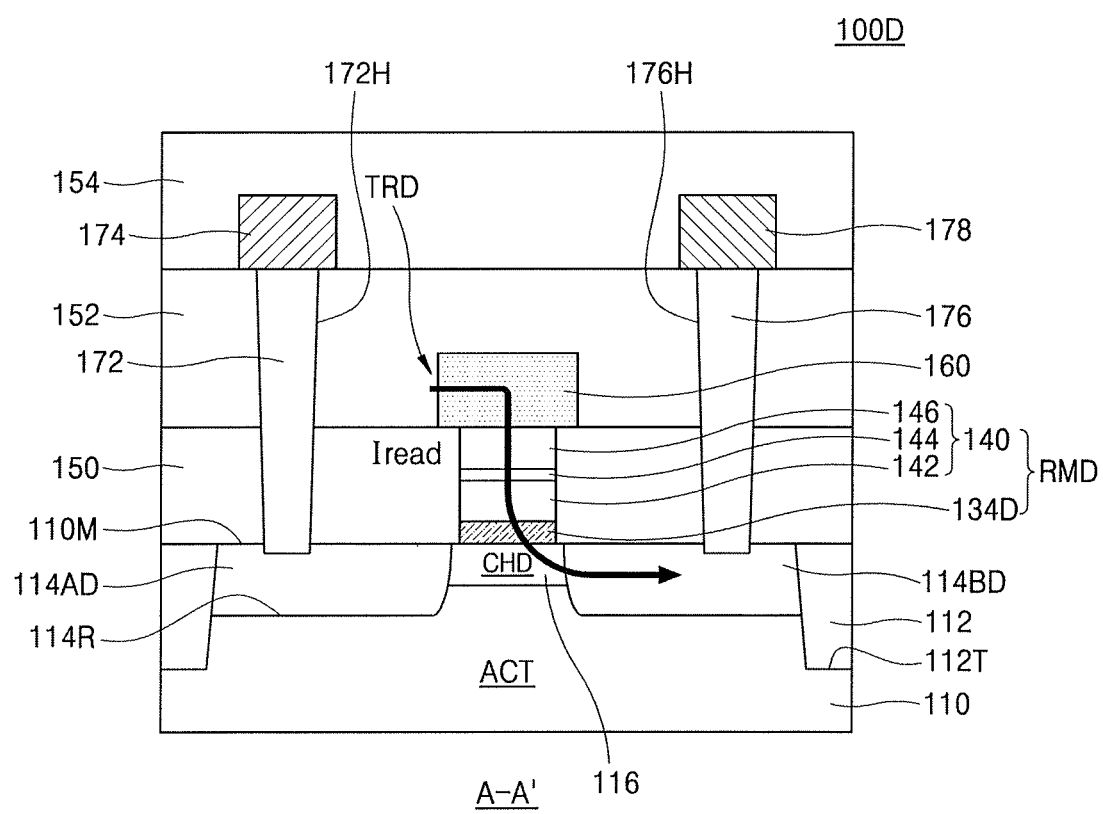

FIGS. 14 and 15 are schematic views illustrating a method of driving the magnetic memory device 100D according to an example embodiment. FIGS. 14 and 15 schematically show write and read operations of the magnetic memory device 100D according to an example embodiment.

Referring to FIG. 14, the selection transistor TRD may be turned on when a write voltage is applied to the word line 160, a source line voltage is applied to the source line 174, and a drain voltage is applied to the bit line 178, and a write current $I_{write}$ flows from the source region 114AD to the drain region 114BD via the channel portion CH. Here, the spin current $I_{spin}$ may be generated by the spin Hall effect of the channel portion CHD, and the spin current $I_{spin}$ may be applied to the free layer 142 via the insulating spacer 134D. For example, the spin current $I_{spin}$ may be generated in a direction perpendicular to the write current $I_{write}$. Accordingly, the magnetization direction of the free layer 142 may be changed by the spin current $I_{spin}$ and thus data may be written to the magnetic memory unit RMD.

Referring to FIG. 15, when a read voltage is applied to the word line 160 and a drain voltage is applied to the bit line 178, the read current $I_{read}$ may flow through the word line 160, the MTJ structure 140, the channel portion CHD, and the drain region 114BD. The value of the read current $I_{read}$ may vary depending on the resistance state of the MTJ structure 140, that is, the magnetization direction of the free layer 142 and the magnetization direction of the pinned layer 146. By comparing the measured read current Lead with a comparison value, it is possible to detect whether the MTJ structure 140 is in a low resistance state (data 0 or 1) or a high resistance state (data 1 or 0). Accordingly, data stored in the MTJ structure 140 may be determined.

Figure 16:
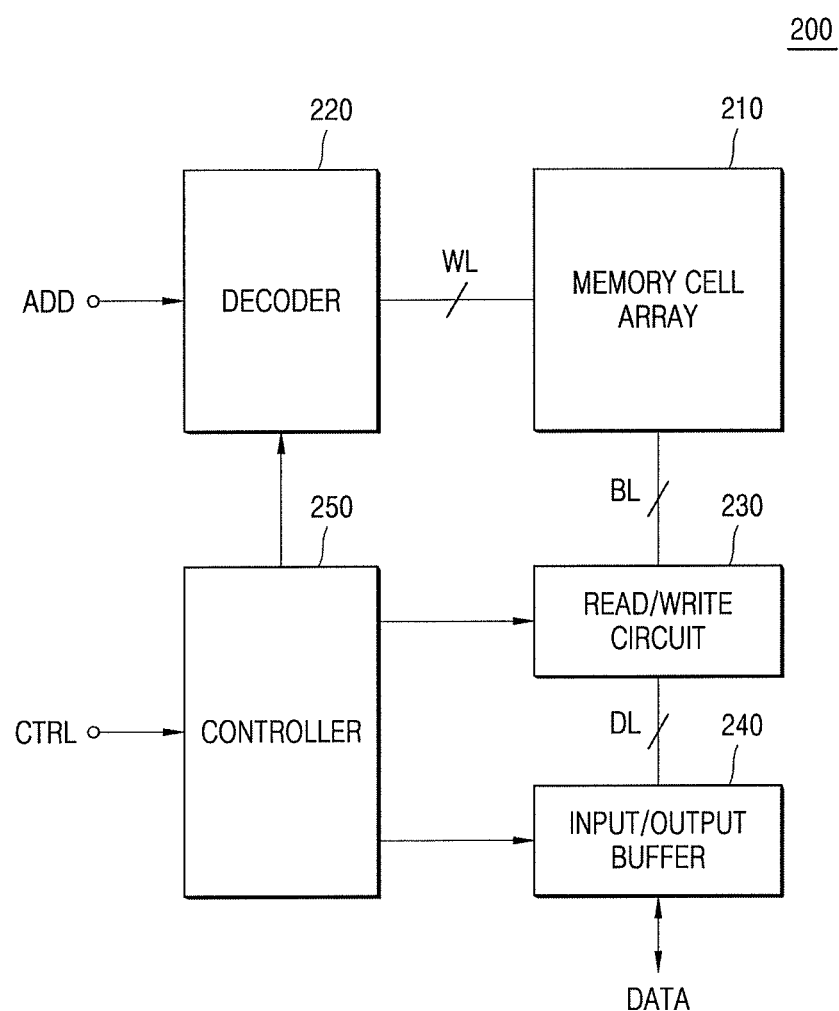
FIG. 16 illustrates a block diagram of a memory device including a magnetic memory device according to an example embodiment.

FIG. 16 is a block diagram of a memory device 200 including a magnetic memory device according to an example embodiment.

Referring to FIG. 16, the memory device 200 according to an example embodiment includes a memory cell array 210, a decoder 220, a read/write circuit 230, an input/output buffer 240, and a controller 250. The memory cell array 210 may include at least one of the magnetic memory devices 100, 100A, 100B, 100C, and 100D described with reference to FIGS. 1 to 15.

A plurality of memory cells in the memory cell array 210 are connected to the decoder 220 through the word line WL and to the read/write circuit 230 through the bit line BL. The decoder 220 receives an external address ADD and may decode a row address and a column address to be accessed in the memory cell array 210 under the control of the controller 250 operating according to a control signal CTRL.

The read/write circuit 230 receives data DATA from the input/output buffer 240 and a data line DL, and may write data to selected memory cells of the memory cell array 210 under the control of the controller 250 or may provide the input/output buffer 240 with data read from the selected memory cells of the memory cell array 210 under the control of the controller 250.

By way of summation and review, as an MTJ cell of a highly integrated magnetic random access memory (MRAM) device is miniaturized, an MRAM device for storing information by programming the MTJ cell using spin orbit torque has been considered. Such MRAM devices operate with fast switching and low current.

As described above, embodiments relate to a magnetic memory device including a magnetic tunnel junction structure.

Embodiments may provide a magnetic memory device capable of performing fast switching and low current operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A magnetic memory device, comprising:
 a device isolation layer on a substrate and defining an active region;
 a source region and a drain region apart from each other in the active region of the substrate;
 a channel portion in the active region of the substrate and between the source region and the drain region;
 a spin orbit torque (SOT)-inducing layer on the channel portion of the substrate;
 a magnetic tunnel junction (MTJ) structure on the SOT-inducing layer, the MTJ structure including:
  a free layer on the SOT-inducing layer,
  a tunnel barrier layer on the free layer, and
  a pinned layer on the tunnel barrier layer;
 a word line on the MTJ structure;
 a source line electrically connected to the source region; and
 a bit line electrically connected to the drain region.

2. The magnetic memory device as claimed in claim 1, wherein an entire upper surface of the MTJ structure is covered by the word line.

3. The magnetic memory device as claimed in claim 1, wherein the SOT-inducing layer includes one or more of tungsten, platinum, tantalum, hafnium, rhenium, iridium, gold, silver, titanium, copper, bismuth telluride, bismuth selenide, antimony telluride, molybdenum sulfide, molybdenum telluride, tungsten sulfide, or tungsten telluride.

4. The magnetic memory device as claimed in claim 1, wherein the magnetic memory device is configured such that, in a write operation, a write current flows from the source region to the drain region through the channel portion and the SOT-inducing layer.

5. The magnetic memory device as claimed in claim 4, wherein the magnetic memory device is configured such that, in the write operation, a spin current is transmitted by a spin-orbit coupling characteristic to the free layer in contact with the SOT-inducing layer when the write current flows through the SOT-inducing layer.

6. The magnetic memory device as claimed in claim 1, wherein the magnetic memory device is configured such that, in a read operation, a read current flows from the word line to the drain region through the MTJ structure and the SOT-inducing layer.

7. The magnetic memory device as claimed in claim 1, wherein an upper surface of the word line is disposed at a level higher than an upper surface of the MTJ structure and an upper surface of the SOT-inducing layer based on an upper surface of the substrate.

8. The magnetic memory device as claimed in claim 1, wherein an entire bottom surface of the SOT-inducing layer is in contact with an upper surface of the channel portion.

9. The magnetic memory device as claimed in claim 1, further comprising a metal silicide layer between the SOT-inducing layer and an upper surface of the substrate.

10. The magnetic memory device as claimed in claim 1, further comprising an insulating spacer between the SOT-inducing layer and the MTJ structure.

11. The magnetic memory device as claimed in claim 10, wherein:
 the insulating spacer includes a magnetic insulator, and
 the magnetic insulator includes one or more of yttrium iron garnet, nickel ferrite, manganese ferric oxide, nickel zinc ferrite, or manganese zinc ferrite.

12. A magnetic memory device, comprising:
 a device isolation layer on a substrate and defining a plurality of active regions;
 a source region and a drain region apart from each other in each of the plurality of active regions;
 a channel portion between the source region and the drain region;
 a plurality of magnetic memory units respectively formed on the channel portion; and
 a word line on the plurality of magnetic memory units and extending in a first direction parallel to an upper surface of the substrate, wherein:
 each of the plurality of magnetic memory units includes:
  a spin orbit torque (SOT)-inducing layer on the channel portion; and
  a magnetic tunnel junction (MTJ) structure on the SOT-inducing layer, the MTJ structure including a free layer, a tunnel barrier layer, and a pinned layer, and
 the word line is disposed at a level higher than that of the MTJ structure.

13. The magnetic memory device as claimed in claim 12, wherein:
 the plurality of magnetic memory units include a first magnetic memory unit and a second magnetic memory unit that are apart from each other in the first direction,
 the word line covers both an upper surface of the first magnetic memory unit and an upper surface of the second magnetic memory unit, and
 a first SOT-inducing layer included in the first magnetic memory unit is apart from a second SOT-inducing layer included in the second magnetic memory unit.

14. The magnetic memory device as claimed in claim 13, further comprising an insulating layer surrounding sidewalls of the first magnetic memory unit and the second magnetic memory unit,
 wherein sidewalls of the first SOT-inducing layer and the second SOT-inducing layer are surrounded by the insulating layer.

15. The magnetic memory device as claimed in claim 12, wherein:
 the plurality of magnetic memory units include a first magnetic memory unit and a second magnetic memory unit that are apart from each other in the first direction,
 the word line covers both an upper surface of the first magnetic memory unit and an upper surface of the second magnetic memory unit, and
 the SOT-inducing layer included in the first magnetic memory unit is connected to the SOT-inducing layer included in the second magnetic memory unit.

16. The magnetic memory device as claimed in claim 15, wherein the SOT-inducing layer vertically overlaps the plurality of active regions and extends in the first direction.

17. A magnetic memory device, comprising:
- a channel portion on a substrate and including a compound semiconductor in which a spin orbit torque (SOT)-inducing dopant is included at a first concentration, the compound semiconductor including at least one of a Group III-V semiconductor and a Group II-VI semiconductor;
- a source region and a drain region on the substrate and apart from each other with the channel portion therebetween;
- an insulating spacer on the channel portion and including a magnetic insulator;
- a magnetic tunnel junction (MTJ) structure on the insulating spacer, the MTJ structure including:
  - a free layer on the insulating spacer,
  - a tunnel barrier layer on the free layer, and
  - a pinned layer on the tunnel barrier layer;
- a word line on the MTJ structure;
- a source line electrically connected to the source region; and
- a bit line electrically connected to the drain region.

18. The magnetic memory device as claimed in claim 17, wherein the SOT-inducing dopant includes one or more of gallium, aluminum, indium, boron, or phosphorus.

19. The magnetic memory device as claimed in claim 17, wherein:
- the magnetic memory device is configured such that, in a write operation, a write current flows from the source region to the drain region through the channel portion in a write operation, and
- is configured such that, in the write operation, a spin current is transmitted to the free layer by a spin-orbit coupling characteristic via the insulating spacer in contact with the channel portion when the write current flows through the channel portion.

* * * * *